United States Patent [19]
Hsu

[11] Patent Number: 6,077,770
[45] Date of Patent: Jun. 20, 2000

[54] DAMASCENE MANUFACTURING PROCESS CAPABLE OF FORMING BORDERLESS VIA

[75] Inventor: Chen-Chung Hsu, Taichung, Taiwan

[73] Assignee: United Microelectronics Corp., Hsinchu, Taiwan

[21] Appl. No.: 09/183,576

[22] Filed: Oct. 30, 1998

[51] Int. Cl.[7] .............................................. H01L 21/4763
[52] U.S. Cl. ........................ 438/622; 438/618; 438/624; 438/633; 438/629; 438/675; 438/637
[58] Field of Search ........................... 438/618, 622–626, 438/629, 631, 633, 637–640, 667–668, 672–673, 675, 692, 700, 701

[56] References Cited

U.S. PATENT DOCUMENTS

| | | | |
|---|---|---|---|
| 5,935,868 | 8/1999 | Fang et al. ................................ | 438/692 |
| 5,960,316 | 9/1999 | Bai .......................................... | 438/633 |
| 5,981,373 | 11/1999 | Koyama .................................. | 438/633 |
| 6,015,734 | 1/2000 | Huang et al. ............................ | 438/253 |
| 6,017,813 | 1/2000 | Kuo ......................................... | 438/618 |

*Primary Examiner*—Charles Bowers
*Assistant Examiner*—Thanh Nguyen
*Attorney, Agent, or Firm*—Hickman Stephens Coleman & Hughes LLP

[57] ABSTRACT

A damascene manufacturing process capable of forming borderless via. The process includes the steps of forming a first trench in a first dielectric layer above a substrate, and then forming a conductive line within the first trench. Thereafter, a portion of the conductive line is removed to form a second trench within the first dielectric layer directly above the conductive line. Next, material is deposited into the second trench to form a cap layer. Subsequently, a second dielectric layer is deposited over the first dielectric layer, and then the second dielectric layer is patterned to form a via opening that exposes the cap layer. Next, the cap layer is removed to form a cavity region that exposes the conductive line. Finally, a plug is formed within the cavity region and the via opening such that the plug is electrically connected with the conductive line.

20 Claims, 5 Drawing Sheets

DAMASCENE MANUFACTURING PROCESS CAPABLE OF FORMING BORDERLESS VIA

BACKGROUND OF THE INVENTION

1. Field of Invention

The present invention relates to a damascene manufacturing process. More particularly, the present invention relates to a damascene manufacturing process capable of forming borderless via.

2. Description of Related Art

Conventionally, there are two major methods of fabricating metallic lines. The first method of forming metallic lines includes depositing metallic material over interconnects to form a metallic layer, and then forming a patterned photoresist layer over the metallic layer. Thereafter, using the photoresist pattern as a mask, the metallic layer is etched to form the required metallic lines, and finally an inter-layer dielectric is deposited to cover the metallic lines. The second method of forming metallic lines is a damascene process. In the second method, a dielectric layer is formed over interconnects, and then a patterned photoresist layer is formed over the dielectric layer. Subsequently, an etching technique is used to form a trench in the dielectric layer, and then metallic material is deposited to fill the trench. Finally, a chemical-mechanical polishing (CMP) method is used to remove excess metal and planarize the dielectric layer, thereby completing the damascene process.

As the number of conductive lines in an integrated circuit chip continues to increase, designs having two or more metallic layers are unavoidable. Often, an inter-metal dielectric (IMD) is formed between different metallic layers for isolation purposes.

Conventionally, when via openings are patterned within the dielectric layer, extra area is often reserved around the edges of the via following the design rule. The extra area serves to self-correct any errors resulting from pattern misalignment and therefore avoids problems caused by an increase in contact resistance between the via and the conductive lines below.

However, in modern semiconductor manufacturing, in which the line width of typical devices shrinks to less than 0.25 µm, borderless vias must be used in order to save space. In other words, no extra space is now reserved around the via openings so that the dimensions of each device can be lowered. Without any border area surrounding a via, any misalignment of the via opening with respect to the underlying conductive line will tend to increase contact resistance between the two. An increase in contact resistance will result in an increase in the operating speed of a device, thereby leading to a deterioration of device quality. In some cases, the via opening may be so much out of place that contact between the via and the conductive line below is severed. This will lead to an open circuit condition, causing device malfunction.

FIGS. 1A through 1E are cross-sectional views showing the progression of conventional manufacturing steps necessary for producing a damascene structure that can accommodate a borderless via design.

First, as shown in FIG. 1A, a substrate structure 100 having a planarized surface is first provided. (To simplify the figure, devices within the substrate structure 100 are not drawn.) Then, a dielectric layer 102 is formed over the substrate structure 100. The dielectric layer 102 can be a silicon oxide layer formed using, for example, a chemical vapor deposition method. Thereafter, conventional photolithographic and etching techniques are used to form trenches 104a, 104b and 104c in the dielectric layer 102 to accommodate subsequently formed lower conductive lines. The trenches 104a, 104b and 104c also expose a portion of the substrate structure 100.

Next, as shown in FIG. 1B, a layer of conductive material is deposited over the substrate structure 100 to fill the trenches 104a, 104b and 104c. The conductive material can be copper, aluminum or aluminum/copper alloy, for example. Thereafter, excess conductive material above the dielectric layer 102 is removed using a chemical-mechanical polishing (CMP) method. Consequently, conductive lines 106a, 106b and 106c are formed within the trenches 104a, 104b and 104c, respectively, thereby establishing the first conductive line layer (the lower layer) in the damascene process.

Next, as shown in FIG. 1C, another dielectric layer 112 is deposited over the dielectric layer 102 and the conductive lines 106a, 106b and 106c. The dielectric layer 112 can be a silicon oxide layer formed using, for example, a chemical vapor deposition method. In the subsequent step, the dielectric layer 112 is planarized using a chemical-mechanical polishing operation so that thickness of the dielectric layer 112 is roughly equal to the height of the intended via.

Next, as shown in FIG. 1D, conventional photolithographic and etching processes are used to form a via opening 114 in the dielectric layer 112a. The via opening 114 exposes a portion of the conductive line 106b. However, due to misalignment of the via opening 114 relative to the conductive line 106b, only a portion of the conductive line 106b is exposed. When the misalignment is serious, not even the sidewall of the conductive line 116b is in contact with the via opening 114. Consequently, the subsequently formed via will have little contact area with the conductive line 106b. In some circumstances, an open-circuit condition leading to device malfunction may occur.

Next, as shown in FIG. 1E, a glue/barrier layer 118 conformal to the surface of the via opening 114 is deposited over the substrate structure 100. The glue/barrier layer 118 is used to boost the adhesion between a subsequently deposited conductive layer and other material layers. Thereafter, a conductive layer is deposited over the substrate structure 100. For example, a chemical vapor deposition method is used to deposit a layer of tungsten over the substrate 100. The conductive layer, which is electrically connected with the conductive line 106b, fills the via opening 114 completely. Subsequently, an etching back or a chemical-mechanical polishing operation is carried out to remove excess conductive material above the dielectric layer 112a, thereby forming a via plug 120 within the via opening 114. Due to via misalignment, only a portion of the via plug 120 is in electrical contact with the conductive line 106b.

In the aforementioned process of forming a via opening, contact area between the via plug and the lower conductive line will be reduced as a result of misalignment. Therefore, contact resistance across the via and the conductive line can greatly increase. Hence, the operating speed of the device may be lower and the quality of the device may be compromised. Sometimes, the misalignment may be so severe as to cause an open-circuit condition that may lead to complete malfunction of the device.

In light of the foregoing, there is a need to provide an improved damascene manufacturing process.

SUMMARY OF THE INVENTION

Accordingly, the present invention is to provide a damascene process that can accommodate a borderless via design.

The damascene process involves etching back to remove a portion of the conductive line, and then depositing over the conductive line material different from the surrounding inter-metal dielectric layer to form a cap layer. Thereafter, the cap layer can be removed to expose the underlying conductive line even when the subsequently formed via opening is seriously misaligned. With this arrangement, the subsequently formed via plug is able to contact the conductive line fully, thereby avoiding problems such as high contact resistance or an open-circuit condition.

To achieve these and other advantages and in accordance with the purpose of the invention, as embodied and broadly described herein, the invention provides a damascene manufacturing process that can accommodate a borderless via design. The process includes the steps of forming a first trench in a first dielectric layer above a substrate, and then forming a conductive line within the first trench. Thereafter, a portion of the conductive line is removed to form a second trench within the first dielectric layer directly above the conductive line. Next, material is deposited into the second trench to form a cap layer. Subsequently, a second dielectric layer is deposited over the first dielectric layer, and then the second dielectric layer is patterned to form a via opening that exposes the cap layer. Next, the cap layer is removed to form a cavity region that exposes the conductive line. Finally, a plug is formed within the cavity region and the via opening such that the plug is electrically connected with the conductive line.

It is to be understood that both the foregoing general description and the following detailed description are exemplary, and are intended to provide further explanation of the i on as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
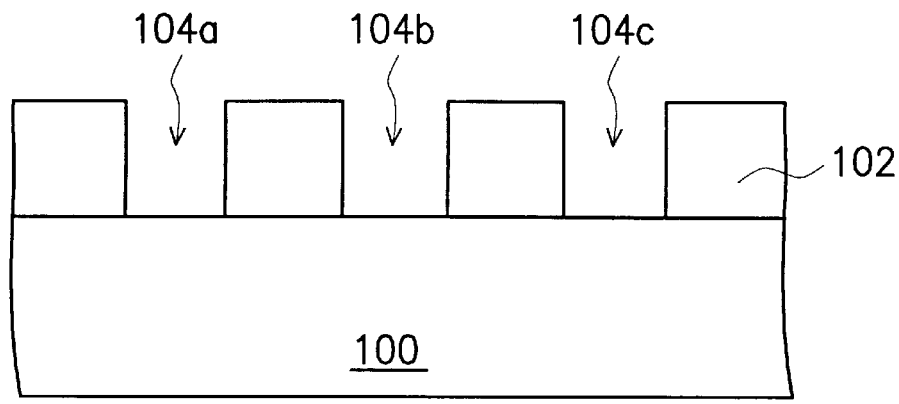
FIGS. 1A through 1E are cross-sectional views showing the progression of conventional manufacturing steps necessary for producing a damascene structure that can accommodate a borderless via design.
Figure 1B:
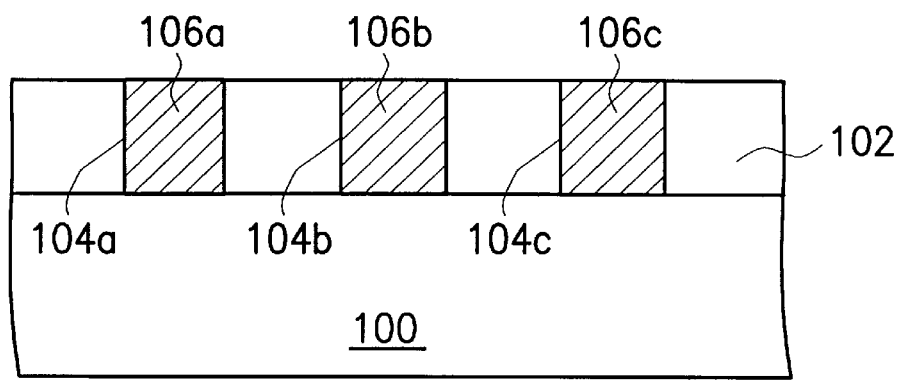
Figure 1C:
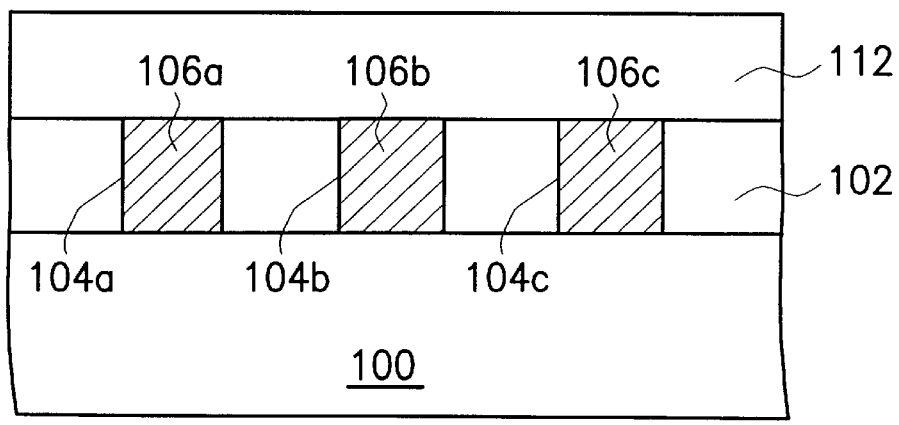
Figure 1D:
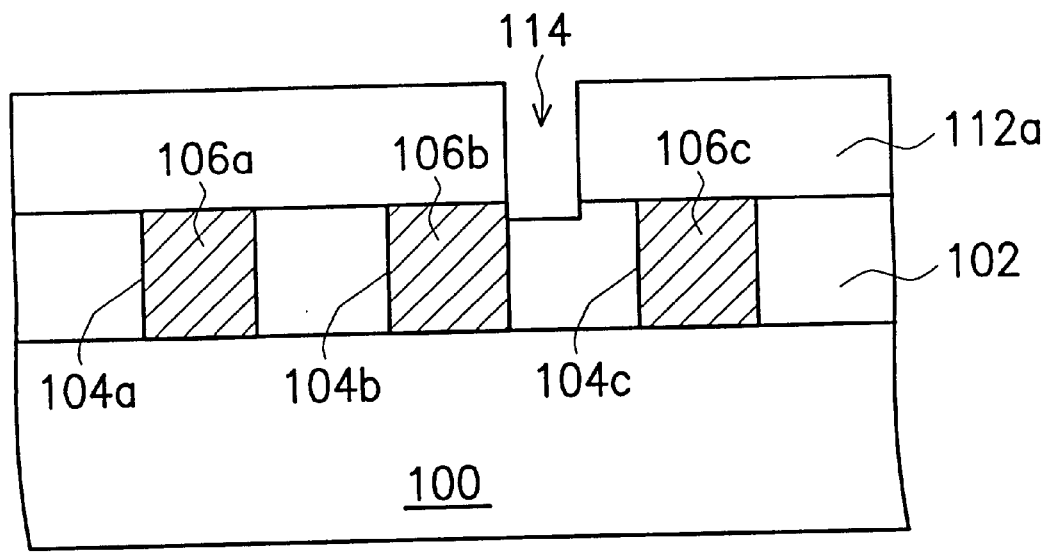
Figure 1E:
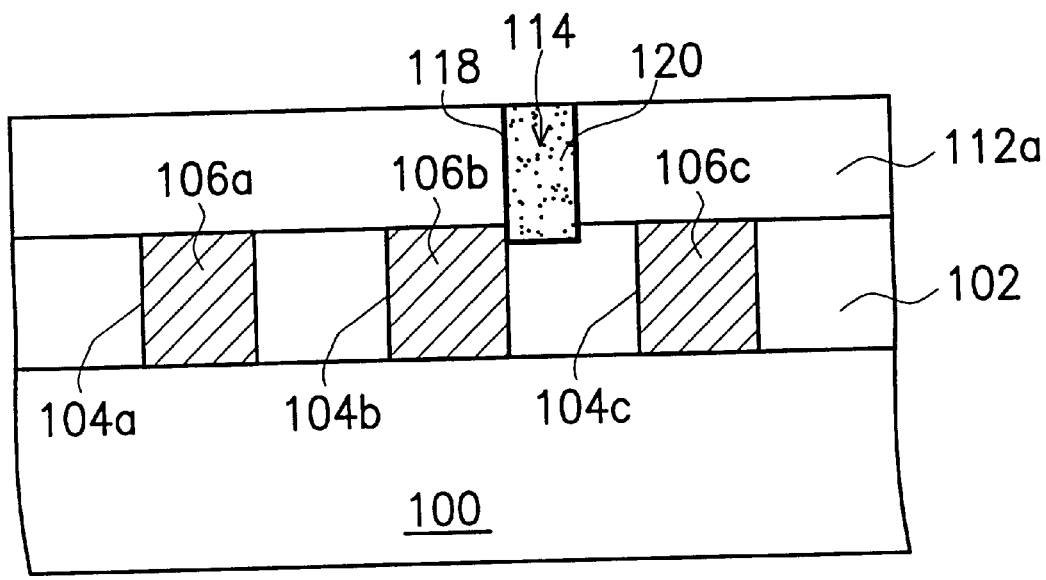

Reference will now be made in detail to the present preferred embodiments of the invention, examples of which are illustrated in the accompanying drawings. Wherever possible the same reference numbers are used in the drawings and the description to refer to the same or like parts.

FIGS. 2A through 2H are cross-sectional views showing the progression of manufacturing steps for producing a damascene structure that can accommodate a borderless via design according to one preferred embodiment of this invention.

Figure 2A:
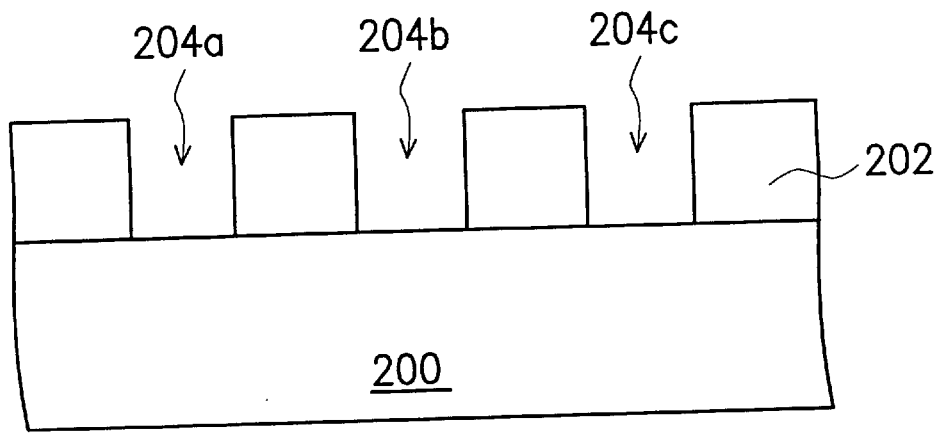
FIGS. 2A through 2H are cross-sectional views showing the progression of manufacturing steps for producing a damascene structure that can accommodate a borderless via design according to one preferred embodiment of this invention.

First, as shown in FIG. 2A, a substrate structure 200 having a planarized surface is first provided. (To simplify the figure, devices within the substrate structure 200 are not drawn.) Then, a dielectric layer 202 is formed over the substrate structure 200. The dielectric layer 202 can be a silicon oxide layer formed using, for example, a chemical vapor deposition method. Thereafter, conventional photolithographic and etching techniques are used to form trenches 204a, 204b and 204c in the dielectric layer 202 to accommodate subsequently formed lower conductive lines. The trenches 204a, 204b and 204c also expose a portion of the substrate structure 200.

Figure 2B:
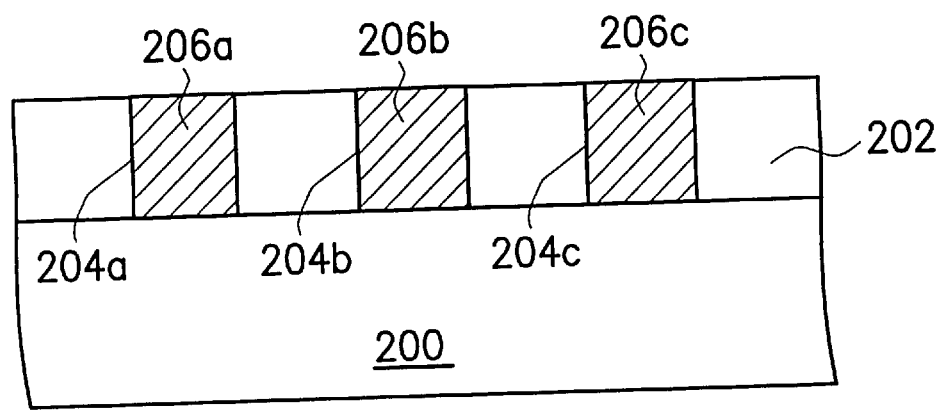

Next, as shown in FIG. 2B, a layer of conductive material is deposited over the substrate structure 200 to fill the trenches 204a, 204b and 204c. The conductive material can be copper, aluminum or aluminum/copper alloy, for example. Thereafter, excess conductive material above the dielectric layer 202 is removed using a chemical-mechanical polishing (CMP) method. Consequently, conductive lines 206a, 206b and 206c, preferably having a thickness of about 12000 Å, are formed within the trenches 204a, 204b and 204c, respectively, thereby establishing the first conductive line layer (the lower layer) in the damascene process.

Figure 2C:
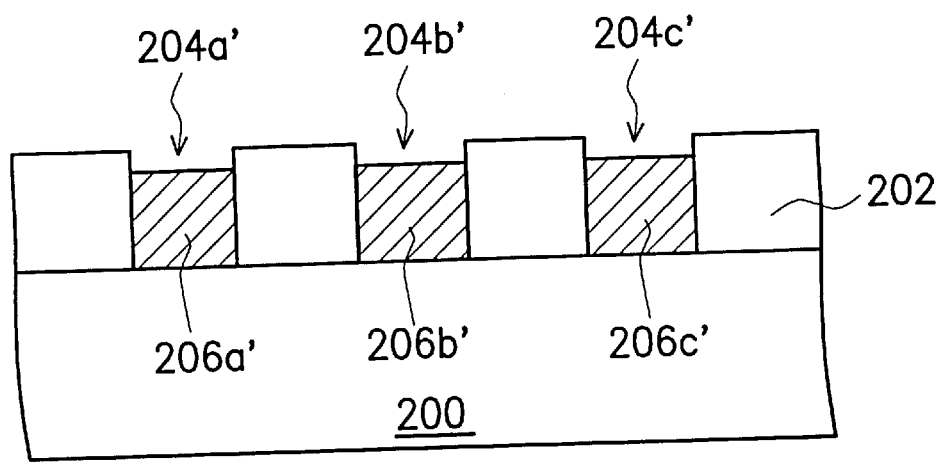

Next, as shown in FIG. 2C, a portion of the conductive lines 206a, 206b and 206c within the dielectric layer 202 is removed using an etching back method. For example, a wet etching method can be used to remove a layer from the top of the conductive lines 206a, 206b and 206c. Ultimately, the thickness of the remaining conductive lines 206a', 206b' and 206c' within the dielectric layer 202 is about 10000 Å, which is equivalent to the necessary height of the lower conductive line. In other words, trenches 204a', 204b' and 204c' are formed in the dielectric layer 202 directly above the respective conductive lines 206a', 206b' and 206c'.

Figure 2D:
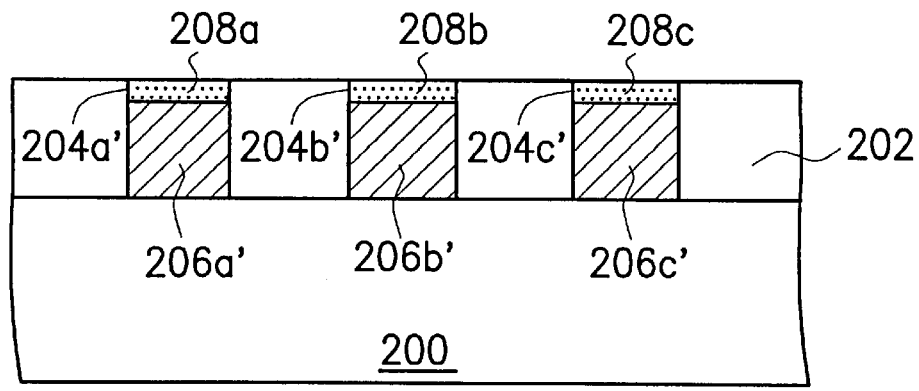

Next, as shown in FIG. 2D, an insulation layer is formed over the dielectric layer 202. The insulation layer is preferably made from a material having a different etching rate from the dielectric layer 202. For example, the insulation layer can be a silicon nitride layer formed using, for example, a chemical vapor deposition method. The insulation layer completely fills the trenches 204a', 204b' and 204c' and covers the conductive lines 206a', 206b', and 206c'. Thereafter, a chemical-mechanical polishing (CMP) method is used to planarize the insulation layer until the dielectric layer 202 is exposed. Ultimately, cap layers 208a, 208b and 208c are formed within the respective trenches 204a', 204b' and 204c' above the conductive lines 206a', 206b' and 206c', respectively.

Figure 2E:
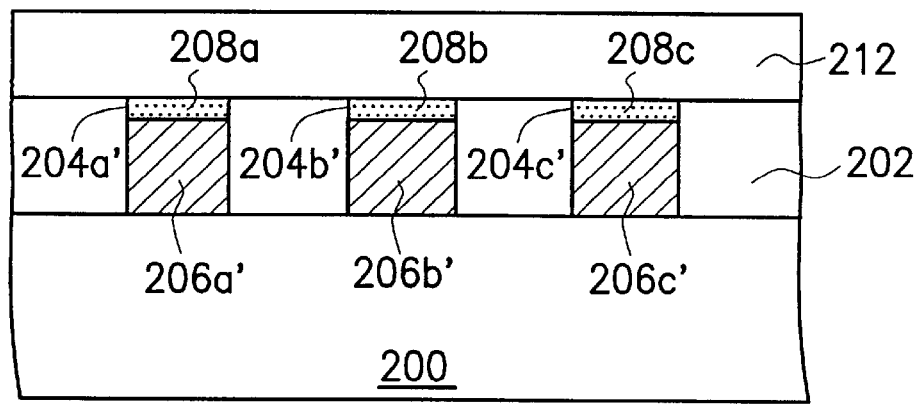

Next, as shown in FIG. 2E, another dielectric layer 212 is formed over the dielectric layer 202 and the cap layers 208a, 208b and 208c. For example, the dielectric layer 212 can be a silicon oxide layer formed using a chemical vapor deposition method. Thereafter, a chemical-mechanical polishing method is used to planarize the dielectric layer 212 so that the dielectric layer 212 has a thickness about the same as the subsequently formed via.

Figure 2F:
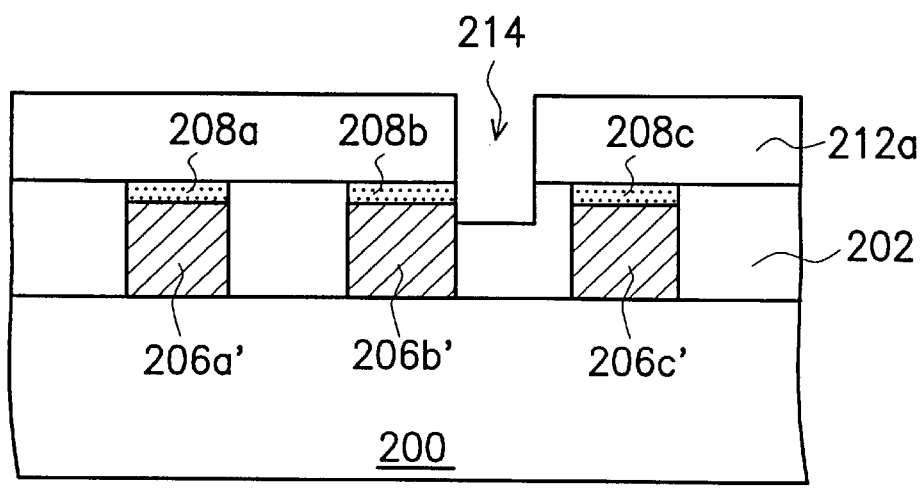

Next, as shown in FIG. 2F, conventional photolithographic and etching processes are carried out in turn to form a via opening 214 in the dielectric layer 212a. The via opening 214 exposes the cap layer 208b. However, if the via opening 214 is misaligned during the patterning operation, only a portion of the cap layer 208b above the conductive line 206b' will be exposed. For example, as shown in FIG. 2F, only the sidewalls of the cap layer 208b and the conductive line 206b' are exposed.

Figure 2G:
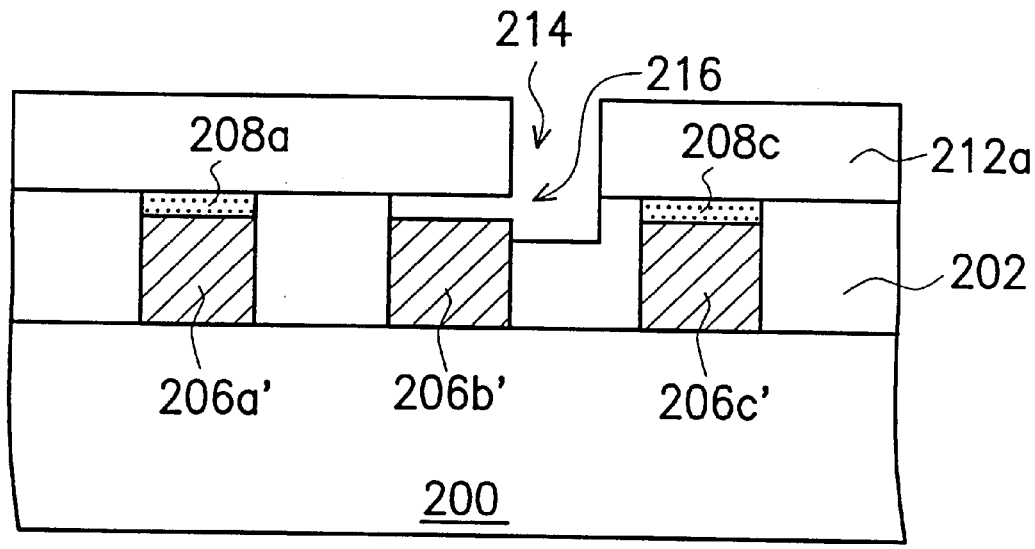

Next, as shown in FIG. 2G, the cap layer 208b above the conductive line 206b' exposed through the via opening 214 is removed using, preferably, a wet etching method. For example, hot phosphoric acid or another etchant capable of selectively removing the cap layer 208b is used to remove the cap layer 208b. Thereby, a cavity region 216 that exposes a portion of the conductive line 206b' is formed underneath the dielectric layer 212a.

Figure 2H:
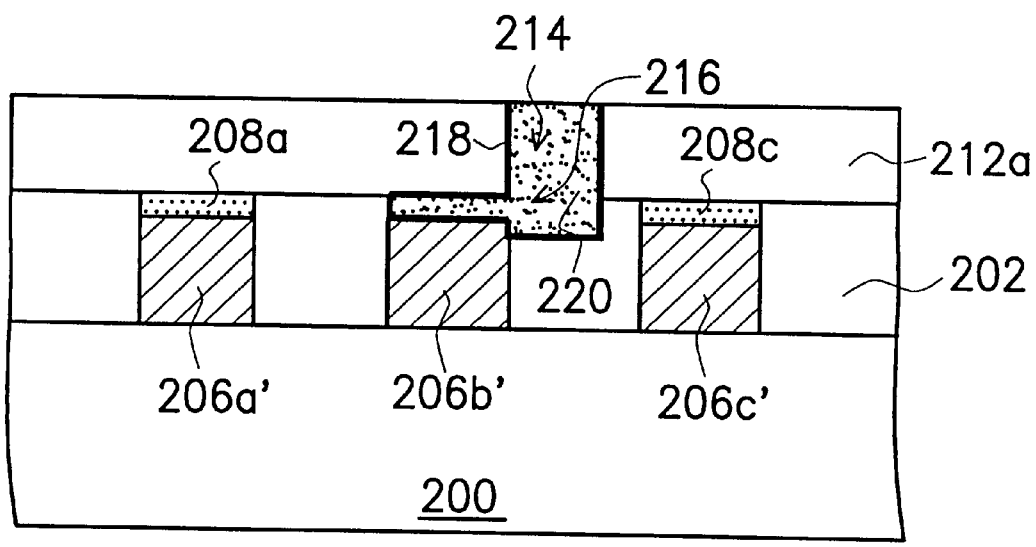

Next, as shown in FIG. 2H, a glue/barrier layer 218 conformal to the surface of the via opening 214 and the cavity region 216 is deposited over the substrate structure 200. The glue/barrier layer 218 can be made from conductive material including titanium/titanium nitride (Ti/TiN) or tantalum/tantalum nitride (Ta/TaN). The glue/barrier layer 218 is used to boost the adhesion between a subsequently deposited conductive layer and other material layers. Thereafter, a conductive layer is deposited over the substrate structure 200. For example, a chemical vapor deposition method is used to deposit a layer of tungsten over the substrate 200. The conductive layer, which is electrically connected with the conductive line 206b', fills the via opening 214 and the cavity region 216 completely. Subsequently, an etching back or a chemical-mechanical polishing operation is carried out to remove excess conductive material above the dielectric layer 212a, thereby forming a via plug 220 within the via opening 214 and the cavity region 216. Furthermore, the via opening 214 is electrically coupled with the conductive line 206b' as well.

In summary, major aspects of this invention include:

1. In the conventional method, if misalignment of a via opening should occur, the contact area between the subsequently formed via and the lower conductive line will shrink, resulting in an increase in contact resistance. If the misalignment is serious, the via may no longer have contact with the lower conductive line, leading to an open-circuit condition and hence to device malfunction.

In this invention, a damascene process is used to form the trench for accommodating the lower conductive line, and then an etching back method is used to remove a portion of the conductive line. Subsequently, a cap layer made from material that differs from the inter-metal dielectric layer is formed above the conductive line. Therefore, the conductive line can still be completely exposed after the cap layer is removed, even if the via opening is seriously misaligned. Consequently, when the via plug is subsequently formed, the via plug will have full contact with the conductive line. Hence, high contact resistance or open-circuit problems are prevented.

2. Since the method can be incorporated in the process design stage, problems due to misalignment can be easily eliminated. Therefore, the overall reliability and quality of integrated circuit products can be improved.

3. The processes used in this invention can be carried out using conventional semiconductor manufacturing equipment. Hence, the method can be easily incorporated into current production facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A damascene manufacturing process capable of forming borderless via, comprising the steps of:

providing a substrate structure having a first dielectric layer with a first trench formed thereon;

forming a first conductive layer over the substrate structure such that the first conductive layer at least fills the first trench completely;

removing a portion of the first conductive layer to expose the first dielectric layer, thereby forming a conductive line within the first trench;

removing a portion of the conductive line, thereby forming a second trench above the conductive line within the first dielectric layer;

forming an insulation layer over the first dielectric layer such that the insulation layer at least fills the second trench completely;

removing a portion of the insulation layer to expose the first dielectric layer, thereby forming a cap layer over the conductive line within the second trench;

forming a second dielectric layer over the first dielectric layer;

patterning the second dielectric layer to form a via opening that exposes the cap layer;

removing the cap layer to form a cavity region that exposes the conductive line;

forming a second conductive layer over the substrate structure such that the second conductive layer at least fills the via opening and the cavity region completely; and removing a portion of the second conductive layer to expose the second dielectric layer, thereby forming a plug within the via opening and the recess cavity such that the plug is electrically coupled with the conductive line.

2. The process of claim 1, wherein the first dielectric layer includes a silicon oxide layer.

3. The process of claim 1, wherein the step of forming the first conductive layer includes depositing copper, aluminum or aluminum/copper alloy.

4. The process of claim 1, wherein the step of removing a portion of the first conductive layer includes using an etching back method.

5. The process of claim 1, wherein the step of forming the insulation layer includes depositing silicon nitride to form a silicon nitride layer.

6. The process of claim 1, wherein the step of removing a portion of the insulation layer includes using a chemical-mechanical polishing method.

7. The process of claim 1, wherein the step of forming the second dielectric layer includes depositing silicon oxide to form an oxide layer.

8. The process of claim 1, wherein the step of removing the cap layer includes using a wet etching method.

9. The process of claim 1, wherein the step of forming the second conductive layer includes depositing tungsten to form a tungsten layer.

10. A damascene manufacturing process capable of forming borderless via, comprising the steps of:

providing a substrate structure having a first dielectric layer with a first trench formed thereon;

forming a conductive line within the first trench;

removing a portion of the conductive line, thereby forming a second trench above the conductive line within the first dielectric layer;

forming a cap layer within the second trench above the conductive line;

forming a second dielectric layer over the first dielectric layer;

patterning the second dielectric layer to form a via opening that exposes the cap layer;

removing the cap layer to form a cavity region that exposes the conductive line; and forming a plug within the via opening and the cavity region such that the plug is electrically coupled with the conductive line.

11. The process of claim 10, wherein the first dielectric layer includes a silicon oxide layer.

12. The process of claim 10, wherein the step of forming the conductive line includes the substeps of:

forming a conductive layer over the substrate structure such that the conductive layer at least fills the first trench completely; and removing a portion of the conductive layer to expose the first dielectric layer, thereby forming a conductive line within the first trench.

13. The process of claim 12, wherein the step of forming the conductive layer includes depositing copper, aluminum or aluminum/copper alloy.

14. The process of claim 12, wherein the step of removing a portion of the conductive layer includes using an etching back method.

15. The process of claim 10, wherein the step of forming the cap layer includes the substeps of:

forming an insulation layer over the first dielectric layer such that the insulation layer at least fills the second trench completely; and removing a portion of the insulation layer to expose the first dielectric layer, thereby forming a cap layer within the second trench above the conductive line.

16. The process of claim 15, wherein the step of forming the insulation layer includes depositing silicon nitride to form a silicon nitride layer.

17. The process of claim 10, wherein the step of forming the second dielectric layer includes depositing silicon oxide to form an oxide layer.

18. The process of claim 10, wherein the step of removing the cap layer includes using a wet etching method.

19. The process of claim 10, wherein the step of forming the plug includes the substeps of:

forming a conductive layer over the substrate structure such that the conductive layer at least fills the via opening and the cavity region completely; and removing a portion of the conductive layer to expose the second dielectric layer, thereby forming a plug within the via opening and the cavity region such that the plug is electrically coupled with the conductive line.

20. The process of claim 19, wherein the step of forming the conductive layer includes depositing tungsten to form a tungsten layer.

* * * * *